US007379452B2

(12) United States Patent
Behrens et al.

(10) Patent No.: US 7,379,452 B2
(45) Date of Patent: *May 27, 2008

(54) SYNCHRONOUS READ CHANNEL

(75) Inventors: Richard T. Behrens, Louisville, CO (US); Kent D. Anderson, Westminster, CO (US); Alan J. Armstrong, Longmont, CO (US); Trent Dudley, Littleton, CO (US); Bill R. Foland, Littleton, CO (US); Neal Glover, Broomfield, CO (US); Larry D. King, Boulder, CO (US)

(73) Assignee: Broadcom Corporation, Irvine, CA (US)

( * ) Notice: Subject to any disclaimer, the term of this patent is extended or adjusted under 35 U.S.C. 154(b) by 1100 days.

This patent is subject to a terminal disclaimer.

(21) Appl. No.: 10/028,871

(22) Filed: Dec. 21, 2001

(65) Prior Publication Data

US 2002/0075861 A1    Jun. 20, 2002

Related U.S. Application Data

(60) Division of application No. 08/838,113, filed on Apr. 16, 1997, now abandoned, which is a division of application No. 08/210,302, filed on Mar. 16, 1994, now Pat. No. 5,812,334, which is a continuation of application No. 08/012,266, filed on Feb. 1, 1993, now Pat. No. 5,424,881.

(51) Int. Cl.
*H04L 12/50* (2006.01)
(52) U.S. Cl. ............................ 370/359; 360/40; 360/51
(58) Field of Classification Search ................ 370/358, 370/359; 324/210, 212; 360/25
See application file for complete search history.

(56) References Cited

U.S. PATENT DOCUMENTS

| | | | | | |
|---|---|---|---|---|---|
| 4,724,496 | A | * | 2/1988 | White | 360/46 |
| 4,945,538 | A | * | 7/1990 | Patel | 714/786 |
| 4,979,055 | A | * | 12/1990 | Squires et al. | 360/69 |
| 5,107,379 | A | * | 4/1992 | Huber | 360/46 |
| 5,140,620 | A | * | 8/1992 | Woodward | 375/375 |
| 5,170,299 | A | * | 12/1992 | Moon | 360/77.08 |
| 5,247,254 | A | * | 9/1993 | Huber et al. | 324/212 |
| 5,255,136 | A | * | 10/1993 | Machado et al. | 360/77.02 |
| 5,329,554 | A | * | 7/1994 | Behrens et al. | 375/340 |
| 5,333,126 | A | * | 7/1994 | Fukuda et al. | 369/59.24 |
| 5,402,200 | A | * | 3/1995 | Shrinkle et al. | 360/69 |

(Continued)

*Primary Examiner*—Chi Pham
*Assistant Examiner*—Kevin Mew
(74) *Attorney, Agent, or Firm*—McAndrews, Held & Malloy, Ltd.

(57) ABSTRACT

A synchronous read channel having a single chip integrated circuit digital portion which provides digital gain control, timing recovery, equalization, digital peak detection, sequence detection, RLL(1,7) encoding and decoding, error-tolerant synchronization and channel quality measurement is disclosed. The integrated circuit accommodates both center sampling and side sampling, and has a high degree of programmability of various pulse shaping and recovery parameters and the ability to provide decoded data using sequence detection or digital peak detection. These characteristics, error-tolerant sync mark detection, and the ability to recover data when the sync mark is obliterated allow a wide variety of retry and recovery strategies to maximize the possibility of data recovery. Various embodiments, including an embodiment incorporating analog as well as digital functions of the read channel in a single integrated circuit, and embodiments utilizing a reduced complexity, programmable modified Viterbi detector supporting a broad class of partial response channels are disclosed.

23 Claims, 5 Drawing Sheets

U.S. PATENT DOCUMENTS

| | | | | |
|---|---|---|---|---|
| 5,416,760 A | * | 5/1995 | Masood et al. | 369/47.2 |
| 5,420,730 A | * | 5/1995 | Moon et al. | 360/77.08 |
| 5,424,881 A | * | 6/1995 | Behrens et al. | 360/40 |
| 5,544,180 A | * | 8/1996 | Gupta | 714/798 |
| 5,771,127 A | * | 6/1998 | Reed et al. | 360/51 |
| 5,812,334 A | * | 9/1998 | Behrens et al. | 360/40 |

* cited by examiner

SYNCHRONOUS READ CHANNEL

This application is a divisional of application Ser. No. 08/838,113 filed Apr. 16, 1997, now abandoned, which is a divisional of U.S. application Ser. No. 08/210,302, now U.S. Pat. No. 5,812,334 issued Sep. 22, 1998, which is a continuation of U.S. application Ser. No. 08/012,266 filed Feb. 1, 1993, now U.S. Pat. No. 5,424,881, issued Jun. 13, 1995, both of which are hereby in corporated by reference in their entireties.

BACKGROUND OF THE INVENTION

In the storage or transmission of digital information, the bits or symbols of the user data are actually transmitted or stored via a physical media or mechanism whose responses are essentially analog in nature. The analog write or transmit signal going into the storage/transmission media or channel is typically modulated by channel bits (typically run-length limited or RLL bits) that are an encoded version of the original user-data bits (non-return-to-zero or NRZ bits). The analog read or receive signal coming from the media is demodulated to detect or extract estimated channel bits, which are then decoded into estimated user-data bits. Ideally, the estimated user-data bits would be an identical copy of the original user-data bits. In practice, they can be corrupted by distortion, timing variations, noise and flaws in the media and in the write/transmit and read/receive channels.

The process of demodulating the analog read signal into a stream of estimated user-data bits can be implemented digitally. Digital demodulation in magnetic mass storage systems requires that the analog read signal be sampled at a rate that is on the order of the channel-bit rate. Maximum-likelihood (ML) demodulation is a process of constructing a best estimate of the channel bits that were written based on digitized samples captured from the analog read signal.

FIG. 1 shows an exemplary read signal 100, which is a positive-going pulse generated by an inductive read head, for example, from a single media transition such as transition 103 from North-South to South-North magnetization of track 104 on a rotating disk. Typically, the write signal modulates a transition in the state of the media to write a channel bit of 1 and modulates the absence of a media transition to write a 0 channel bit. Thus, transition 103 corresponds to a single channel bit of value 1 in a stream of 0's.

It is common to use run-length-limited (RLL) encoding of the original user data bits, which are arbitrary or unconstrained, into an RLL-encoded stream of channel bits. It may be desirable that there be no less than d zeroes between ones; that is, that the media transitions be spaced by at least d+1 channel bit times. This constraint can help keep to a manageable level the interference effects among the pulses in the analog read signal. On the other hand, because media transitions provide timing information that must be extracted from the read signal to ensure synchronization of the demodulator with the pulses in the read signal, it may be desirable that there be no more than k zeroes between ones; that is, that there be a media transition at least every k'th channel bit time. An RLL(d,k) code is a code that can encode an arbitrary stream of original user-data bits into a stream of channel bits such that the encoded channel bit stream satisfies these two constraints. An RLL code has a theoretical capacity which limits the number of user bits which can be represented in a given number of RLL bits. The capacity is a function of the d and k constraints with d=0 and k=infinite being the limiting (unconstrained) case with a capacity of exactly one. The capacity of an RLL (1,7) code for example is just slightly greater than ⅔ and is exactly ⅔ for any practical implementation, meaning that every pair of user bits will map to exactly three RLL bits.

FIG. 1, sample set 101 shows the values of four samples in the case of side sampling of read signal 100; i.e. 0.333, 1.0, 1.0, and 0.333. Sample set 101 is equivalent to the set 1, 3, 3, 1; that is, only the ratios among samples are significant. A signal model gives rise to an expected sample sequence for a single or isolated transition in media state. Typically, only a few samples of an isolated media transition are non-zero; in this case, four are non-zero. In a side-sampled signal model such as 1, 3, 3, 1, timing circuitry in the demodulator attempts to maintain a lock on the incoming signal such that two adjacent samples on opposite sides of the peak of an isolated pulse have equal amplitudes and samples are taken at roughly equal time intervals, each a single channel bit time. Synchronization of the samples with the spacing of the bits written on the media is maintained by a timing recovery loop which is in essence a phase-locked loop. Other sample timing arrangements may be useful. In center sampling, the timing circuitry tries to lock the sample times to the read signal pulses such that one sample occurs at the peak of each pulse. Sample set 102 shows the values of four samples in the case of center sampling of a similar read signal 104; i.e., 0.5, 1.0, 0.5, and 0.0 (or 1.0, 2.0, 1.0 and 0.0 depending on the arbitrary normalization used). An expected sample sequence of 1, 2, 1, 0 corresponds to the signal model known in the prior art as Extended Partial-Response Class IV (EPR4). Such sample sequences are samples of a continuous-time analog read-signal waveform such as may be produced in the readback circuitry of a magnetic storage device. For a system that is bandwidth limited to 1/(2T), where T is the sample spacing in time, the sampling theorem declares that the continuous time waveform must be superposition of sinc functions (sinc(x) is defined as sin (x)/x for x<>0, and as 1 for x=0), with one sinc function centered at each sample point and of amplitude equal to that sample value and with zero crossings at all other sample points. As an example, in saturation magnetic recording, the current in an inductive write head takes on values of +1 and −1. The basic excitation applied to the recording channel is a step in current from +1 to −1, vice versa, in the analog write signal. This step in write current produces a transition in the magnetization state of the media as it moves past the head. When an inductive read head is passed over this magnetic media transition, a voltage pulse is induced by the bandwidth limited differentiating interaction of the head with the magnetization of the media. By suitable filtering or equalization, the sequence of samples on an isolated transition response pulse can be made to { . . . , 0, 0, 1, 2, 1, 0, 0, . . . }, in which case the recording or transmission channel matches the EPR4 signal model. Another sample sequence well known in the prior art is the Partial Response Class IV signal model (PR4), which corresponds to an expected sample sequence of 0, 1, 1, 0. Further, as one is designing or taking measurements on a write/media/read channel, it may be desirable to take into account the exact response, noise and distortion characteristics of the channel in selecting the signal model to be implemented in the demodulator. Thus, there is a need for a demodulator that is programmable as to the signal model, or expected sequence of sample values for an isolated media transition. In situations such as mass information storage in magnetic media, significant storage-system speed and capacity gains can be realized if the information bits can be closer together in position/time on the media. further, as media transitions are more closely positioned, the writing and reading processes become more sensitive to the distortion, timing variations and noise that are inevitably introduced in the processes of writing, storing, and reading. Also, as the transitions become closer, the ability of the media to fully transition from, say, North-South magnetization to South-North magnetization may be taxed. Also, as the media transitions become closer, interference effects increase among adjacent or nearby transitions. FIG. 2 shows how positive-going pulse 200 from first media transition 201 combines with negative-going pulse 202 from second transition 203 to produce analog read signal 204, which can be viewed as the interference of the two pulses. Adjacent media transitions always give rise to read pulses of opposite polarities because they always are created by transitions of opposite types, for example North-South changes to South-North in transition 201, so adjacent transition 202 must be South-North changing back to North-South. Read signal 204 might give rise to a sequence of samples such as 0.333, 1.0, 0.667, −0.667, −1.0, 0.333. To the extent that the read process is linear (and it may not be entirely linear), the voltage waveform induced in the read head will be the superposition of a sequence of pulses, where each pulse is the response to an isolated magnetic transition on the media. Clearly, engineering a high-performance read channel is a complex challenge given the combined effects of the limited sampling rate in a digital demodulator, possibly incomplete transitions in the media, interference among read-signal responses to media transitions, and distortion, timing variations, noise and flaws in the media and in the write and read channels. The prior art uses a method known as partial-response signaling to increase media transition rates. Partial-response signaling is described in the book "Digital Transmission of Information", by Richard E. Blahut, 1990, pp. 139-158 and 249-255. This method allows the analog response of the storage/transmission media and of the write/transmit and read/receive circuitry to a media transition to overlap with the response to adjacent transitions associated with subsequent information bits. If properly implemented, this method can achieve higher information bit rates/densities than the alternative or requiring the media transitions to be spaced such that the read signal responses do not overlap. Such a method requires a sequence detector which can make its decisions not on a bit-by-bit basis but by examining the context of the surrounding read signal.

In a magnetic disk drive, the surface of the magnetic media is logically divided into concentric rings called tracks. The distance around the track varies as a function of the radius at which the track lies. Since it is desirable to keep the rate of revolution of the disk constant to avoid mechanical delays in accelerating and decelerating the disk, it is necessary to either store an amount of data on each track which is proportional to the length of the track (this requires a different data transfer rate for each track) or to vary the physical transition spacing on the media so that pulses are widely separated at the outside diameter and crowded very close at the inner diameter of the recording surface (this is wasteful of the magnetic media which is only sparsely used at the outer diameter). A practice known as zoned recording is a popular compromise between these two extremes. In zoned recording, a group of tracks (a zone) is established in which every track in the zone holds the same amount of data. Thus each zone requires a different data transfer rate, but the number of data transfer rates which need be supported is reduced (more coarsely quantized). This still leaves a variation in the physical spacing of transitions between the inside and outside diameters of each zone resulting in a variation in pulse shape.

Partial-response signaling has just recently been incorporated into mass storage devices and then in a limited form. One prior-art magnetic disk drive using partial-response signaling only supports PR4 (pulses with the samples of . . . , 0, 1, 1, 0, . . . ). PR4 signaling has only very limited inter-symbol interference evidenced by only two non-zero samples in the pulse. To increase the capacity of the media, the user of a PR4 read channel must increase the equalization of the pulses (slim the pulses) in order to limit the inter-symbol interference of adjacent pulses so that any pulse only affects two read signal samples. The increased equalization also enhances the noise accompanying the signal, making the detection task more difficult and errors more likely. U.S. Pat. No. 4,945,538 by Patel covers a similar situation but with EPR4 signaling and an RLL(1,7) code. This improves the allowed amount of inter-symbol interference, increasing it to three non-zero samples of ( . . . , 0, ½, 1, ½, 0, . . . ). Both of these techniques will allow an increase in capacity but are limited in the variety of pulse shapes which can be detected and therefore limited by how much equalization (pulse slimming) may be performed before the effect of equalizing the noise (noise enhancement) becomes intolerable.

Thus, there is a need for a flexible read channel which can accommodate a wide variety of pulse shapes as will be seen in each zone. There is also a need to allow larger amounts of controlled inter-symbol interference between pulses (pulses with more than two or three non-zero pulses) in order to continue increasing the capacity of the recording media.

SUMMARY OF THE INVENTION

A synchronous read channel having a single chip integrated circuit digital portion which provides digital gain control, timing recovery, equalization, digital peak detection, sequence detection, RLL(1,7) encoding and decoding, error-tolerant synchronization and channel quality measurement is disclosed. The integrated circuit accommodates both center sampling and side sampling, and has a high degree of programmability of various pulse shaping and recovery parameters and the ability to provide decoded data using sequence detection or digital peak detection. These characteristics, together with the error-tolerant sync mark detection and the ability to recover data when the sync mark is obliterated, allow a wide variety of retry and recovery strategies to maximize the possibility of data recovery. Various embodiments, including an embodiment incorporating the analog functions as well as the primary digital functions of the read channel in a single integrated circuit, and preferred embodiments utilizing a reduced complexity, programmable modified Viterbi detector supporting a broad class of partial response channels are disclosed.

DETAILED DESCRIPTION OF THE INVENTION

There is attached hereto as Appendix 1 a preliminary data sheet entitled Sample Amplitude Digital R/W Channel, Part Number CL-SH4400 (hereinafter the CL-SH4400), the contents of which data sheet are incorporated herein by reference. This data sheet provides substantial information with respect to a preferred embodiment of the present invention as embodied in integrated circuits about to be introduced. Therefore, portions thereof will be referred to herein from time to time, either as providing support for the description to follow, or a specific example of the application of the descriptions provided herein and in other co-pending applications also incorporated herein by reference.

The CL-SH4400 is a specific embodiment of the present invention designed to work with a companion analog integrated circuit and a disk controller to form a state of the art high density magnetic disk drive. In that regard, the uniqueness of the present invention, while used in a digital read-write channel, is primarily related to its read capability and versatility.

Figure 1:
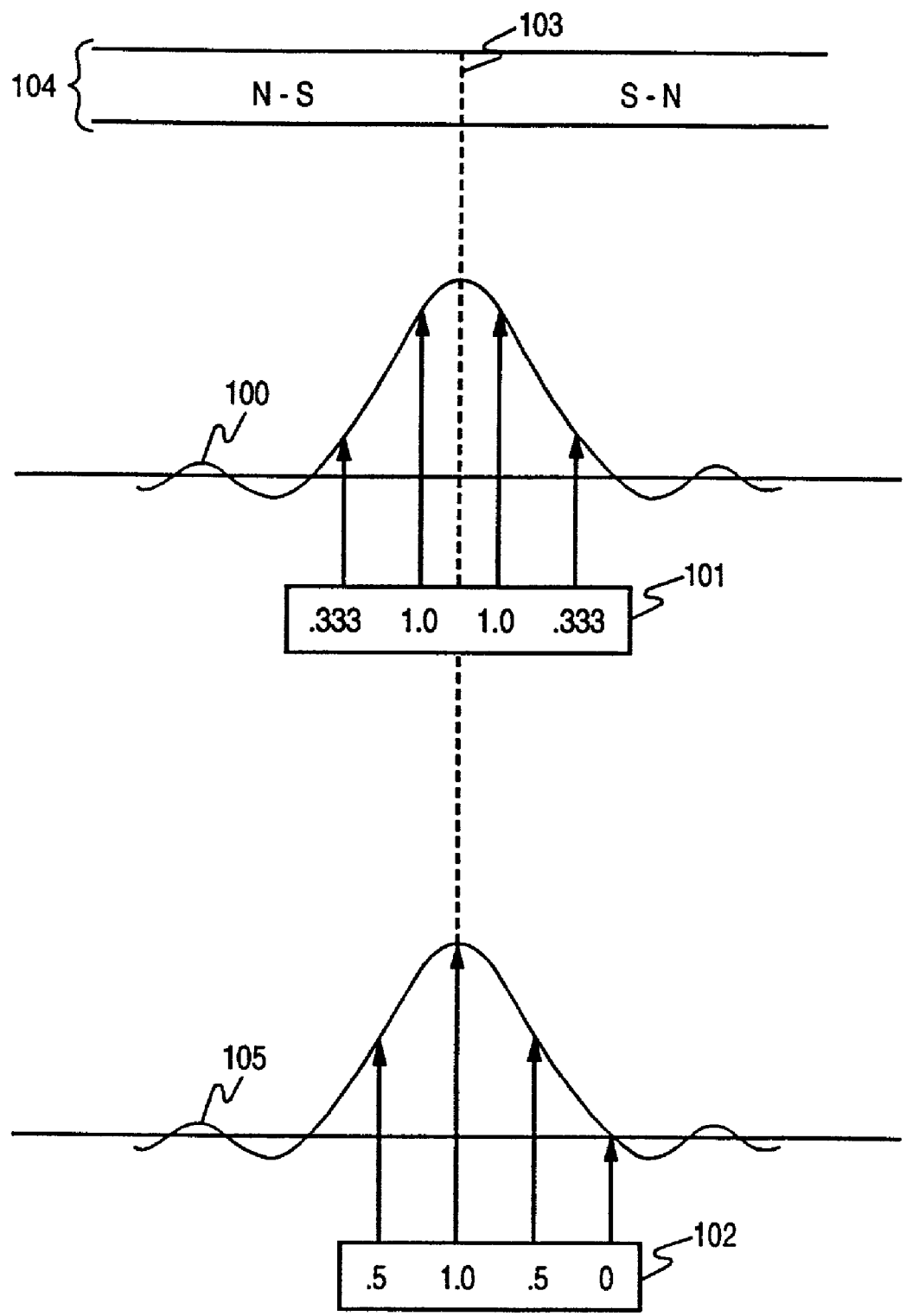
FIG. 1 shows a state transition on a medium such as a track of a disk drive and its associated pulse in an analog read signal. It also shows two digitized sample models of such read-signal pulses.
Figure 2:
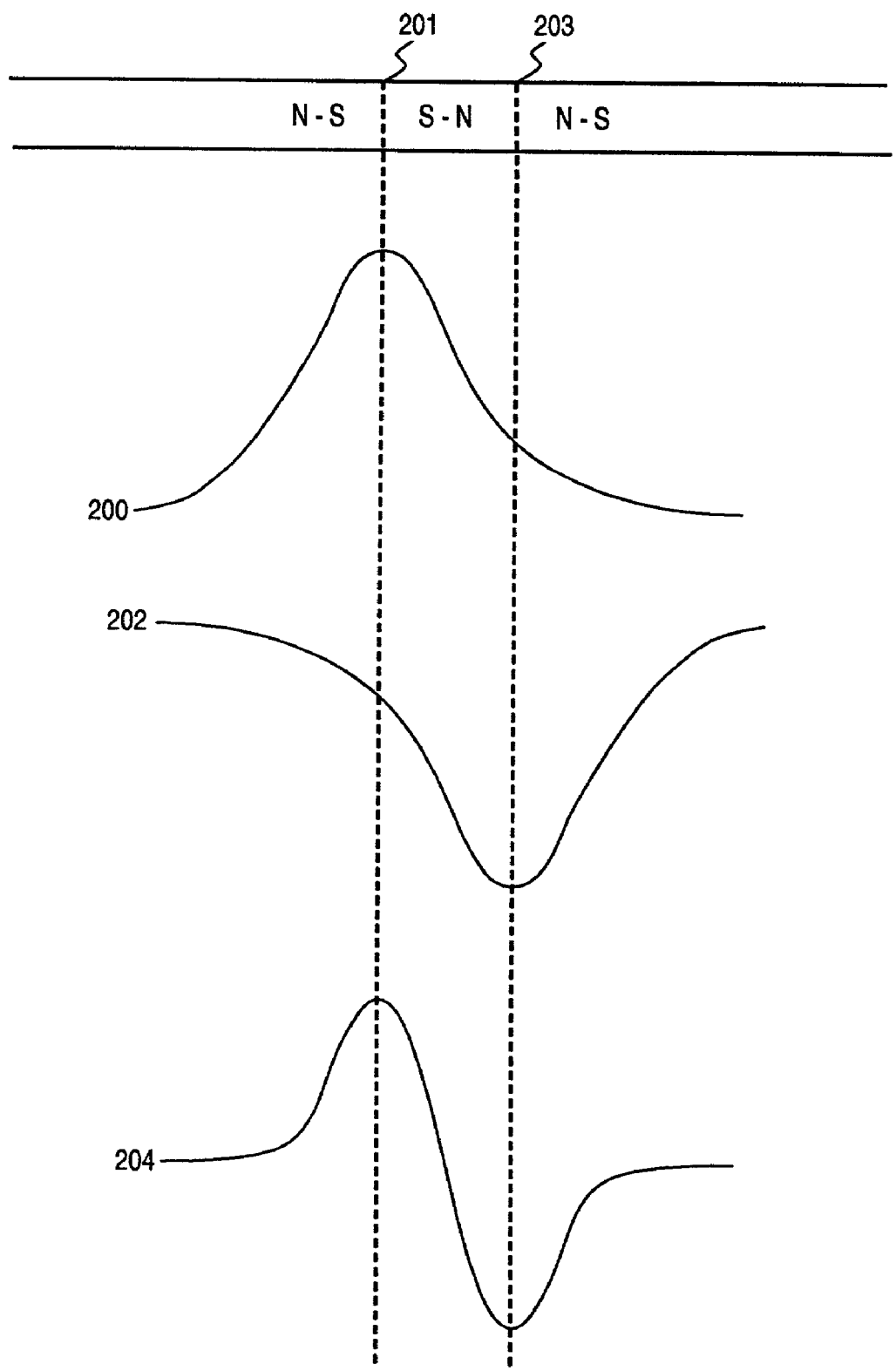
FIG. 2 shows two adjacent medium transitions and their individual and combined read-signal pulses.
Figure 3:
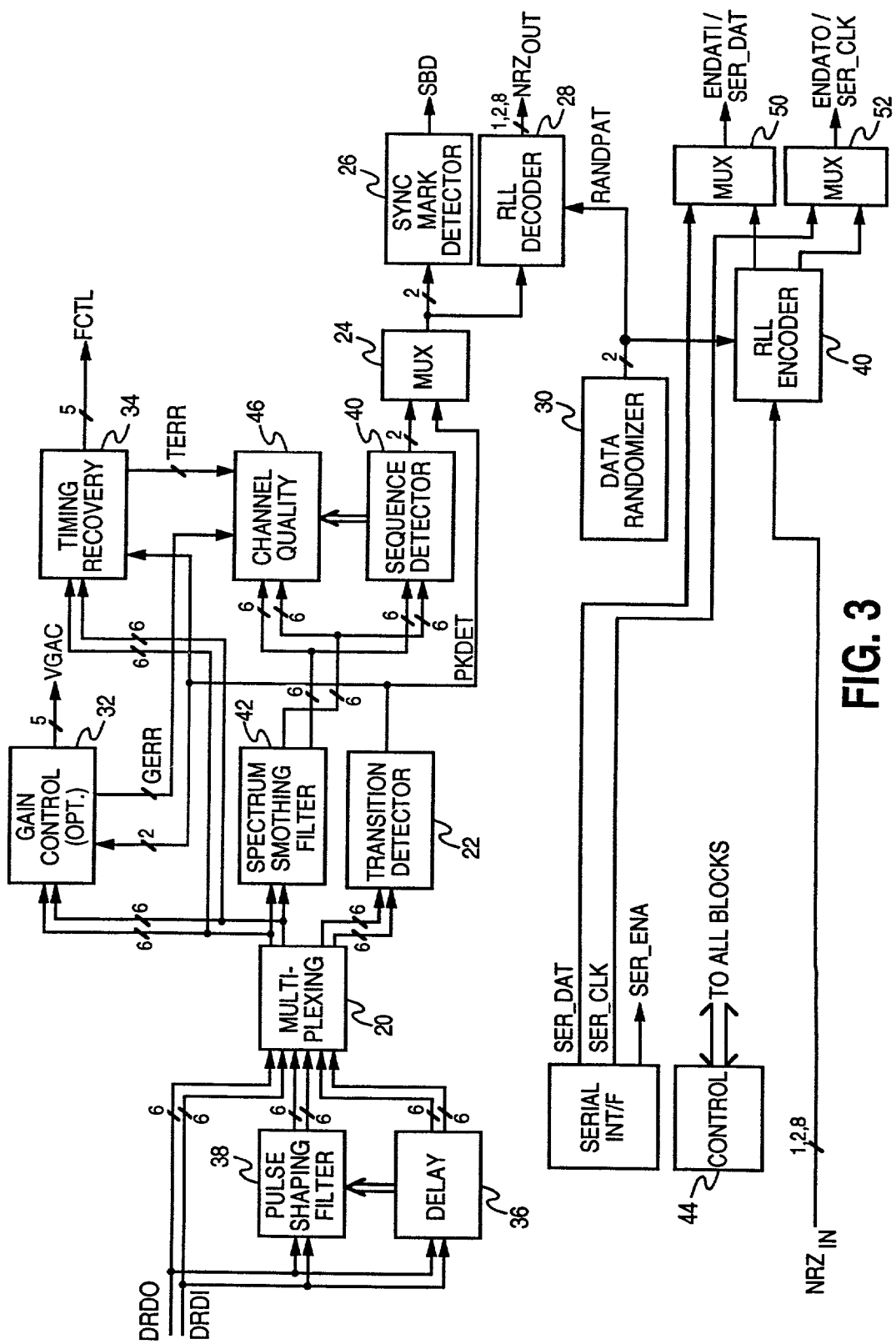
FIG. 3 is an overall block diagram of the present invention.

FIG. 3 provides a block diagram illustrating the general organization of the CL-SH4400. As may be seen in FIG. 3, the digitized read data for the CL-SH4400 is provided in an N-bit parallel form as digitized read data DRD0 and DRD1. Each of these two signals in the preferred embodiment disclosed is a 6-bit digitized read data signal. These two N-bit signals represent digitized samples of a read signal directly from a read head of the storage device after analog amplification and analog filtering. Those skilled in the art will recognize that the purpose of the analog amplifier and the analog filter is to scale the signals to the input range of the digital to analog converter and to attenuate frequencies above the Nyquist frequency (½ the sample frequency) to avoid signal distortion due to aliasing. In general, the analog filter will perform pulse shaping as well. The digitized read data signal DRD0 is a digitized read signal sample effectively taken near the center of a channel bit time (defined by the VFO frequency), subject however to a small amount of timing error or intentional timing set point offset in the VFO. The digitized read data signal DRD1 is the corresponding digitized read sample effectively taken near the center time of the previous logical channel bit, subject of course to similar timing errors and timing set point offsets. These two digitized read data signals are processed in the CL-SH4400 in a parallel or simultaneous manner so that ultimately in the CL-SH4400, two successive bits of digital read data will be derived from one set of DRD0 and DRD1 signals which together with successive bit pairs are decoded by a run-length limited (RLL) decoder and derandomized if applicable (e.g. if initially randomized) to provide the NRZ data output stream of the device. The processing of two digitized read data samples simultaneously doubles the throughput of the CL-SH4400 for a given clock rate without doubling the circuitry required, particularly in the sequence detector, though the present invention is not specifically limited to processing of two digitized read data sample at a time. One could process one digitized read data sample at a time, or alternatively process more than two digitized read data samples at a time, if desired. In that regard, the number of N-bit digitized read data sample connections to the chip normally will equal the number of samples processed at a time, though such signals could be multiplexed so that the number of N-bit digitized read data samples connections to the chip is less than the number of samples processed together.

In one mode of operation, multiplexer 28 couples the DRD0 and DRD1 signals directly to a transition detector 22 which processes the successive samples to detect the presence of transitions in each of the two digitized read data signals. In the preferred embodiment, the transition detector 22 is of the type disclosed in co-pending U.S. application for patent entitled Digital Pulse Detector, filed May 8, 1992 as Ser. No. 07/879,938, the disclosure of which co-pending application is incorporated herein by reference. The output of the transition detector is a low or high level during the respective bit times (delayed as described in the co-pending application) depending upon whether a transition (providing a high level output) or no transition (providing a low level output) was detected. The output of the transition detector 22, the peak detected signal PKDET, in this mode would be coupled to multiplexer 24 and through a sync mark detector 26 to provide a sync byte detected output SBD if a sync byte was in fact detected, and to couple the two bits to the RLL decoder 28 which decodes the bit stream to provide the NRZ data out digital data. In the preferred embodiment run length constraint violations are detected and optionally multiplexed onto the NRZ data out lines. These may be used by an error correcting system within the disk controller. In the preferred embodiment, an error tolerant sync mark detector 26 is used. This detector is designed to achieve a level of error tolerance for the synchronization function equal to that achieved for the data field by the error-correction code implemented in the disk controller. This is achieved in part by employing an error-tolerant Synchronization Mark pattern for minimum cross-correlation with the preamble and for minimum auto-correlation, and by making the number of four-channel-bit groups which must be detected programmable. The synchronization mark recovery procedure may be used to recover data when a severe defect has destroyed the entire synchronization mark. When using this mode, the CL-SH4400 first goes through a normal timing and gain acquisition procedure while counting channel bits. The synchronization mark is assumed to have been detected when the count matches the synchronization mark recovery count. By varying the synchronization mark recount, the microcontroller can vary the assumed starting point of a header or data area until the correct starting point is tried, whereupon the sector will be recovered if there is no other error beyond the capability of the error correction code in the disk controller.

In the CL-SH4400, the NRZ data output is user selectable as a serial bit stream, a 2-bit parallel stream or character wide (8-bit wide) digital data. If the data was randomized prior to storage, the data randomizer 30 may be enabled to de-randomize the data from the RLL decoder 28 before being provided as the NRZ data output.

Figure 4:
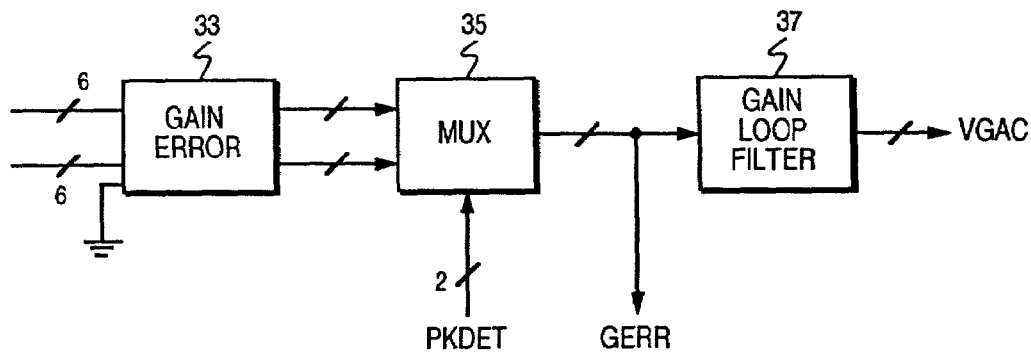
FIG. 4 is a block diagram illustrating the details of the gain control circuit 32 of FIG. 3.

The output of the transition detector 22 in this mode is also provided to the gain control circuit 32 and the timing recovery circuit 34. Also the N-bit digitized samples DRDO and DRD1 are coupled through multiplexer 20 to the gain control circuit 22 and the timing recovery circuit 34. The gain control circuit 32 is shown in more detail in FIG. 4. The gain errors (the difference between the programmable desired signal level referred to as the Gain Set point, and each digitized data signal) are determined for each digitized read data sample by the gain error circuit 33. The outputs PKDET of the transition detector 22 provide references to control the multiplexer 35 of the gain control circuit 32, as the gain adjustments are determined by the signal amplitudes of transitions and not the signal levels between transitions. The automatic gain control signal VGAC (5-bits in the preferred embodiment) for coupling back to the companion integrated circuit for analog amplifier gain control is provided by the digital gain loop filter 37. As shown therein, the gain loop filter includes a loop filter coefficient which is independently programmable for tracking and acquisition. The individual gain errors are also coupled to a channel quality circuit 46 as the signals GERR so that gain control performance can be measured to determine the best choice of loop filter coefficients and other parameters of the channel with respect to the performance of the automatic gain control loop.

Figure 5:
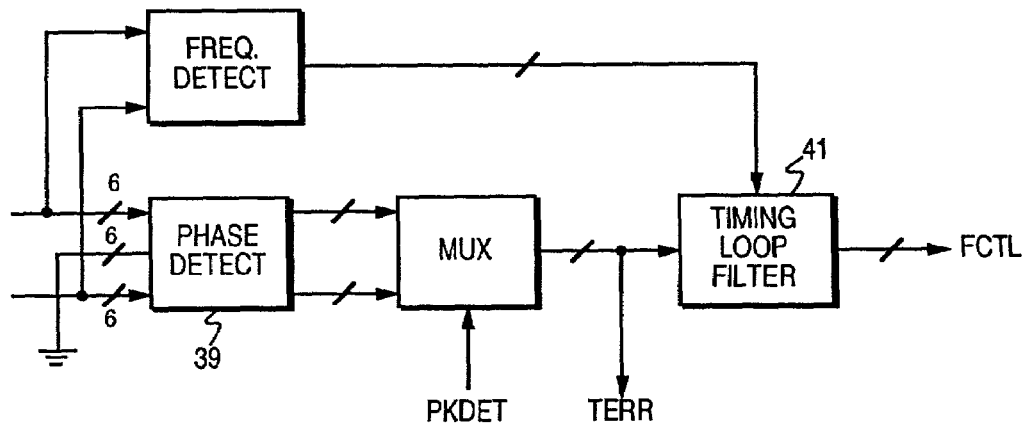
FIG. 5 is a block diagram illustrating the details of the timing recovery circuit 34 of FIG. 3.
Figure 6:
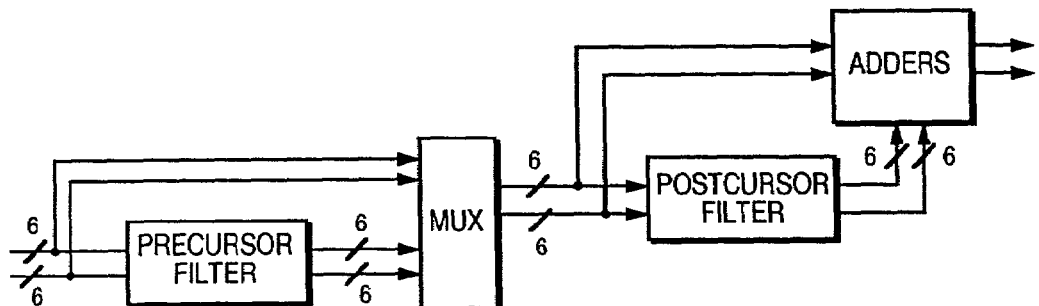
FIG. 6 is a block diagram illustrating the details of the spectrum smoothing filter 42 of FIG. 3.

The timing recovery circuit 34 in the CL-SH4400 is shown in greater detail in FIG. 5, and is generally in accordance with the timing recovery circuit disclosed in a co-pending U.S. patent application entitled Timing Recovery Circuit For Synchronous Wave Form Sampling, filed Sep. 30, 1992 as Ser. No. 07/954,350, the disclosure of which is also incorporated herein by reference. Timing recovery and maintenance of synchronization, of course, can only be done upon the detection of a transition, as the absence of transitions contains no timing information. The timing recovery circuit controls the read clocks which are synchronized to the read wave form. In the timing recovery circuit, a phase detector 39 digitally computes the phase error in the sampling instants of the analog to digital converter on the companion chip from the digitized sample values during transitions, as indicated by the signals PKDET. Providing timing error corrections only at transition times reduces the noise (jitter) in the timing loop. The sequence of measured phase errors is digitally filtered by filter 41 to produce a frequency control signal which is fed back to the companion chip, in the preferred embodiment as the 5-bit frequency control signal FCTL.

The timing recovery circuit 34 also includes a programmable timing set point. The timing set point permits a wider range of sampling strategies which enables the support of a wider range of pulse shapes. The timing set point is useful on retry in the event of the detection of an uncorrectable error. Also the digital filter includes two coefficients which are independently programmable for acquisition and tracking. These are also usable in a retry strategy to change the bandwidth and hence the response time of the timing loop. Like the individual gain errors GERR, the individual timing errors TERR are also coupled to the channel quality circuit for contribution to the quantitative analysis of the channel quality with respect to timing recovery. One alternate embodiment of the timing recovery block includes a frequency error detector. The frequency error detector is used to decrease the time required for the timing loop to lock to the channel bit frequency and phase during the acquisition period before encountering data.

As variations on the mode of operation just described, the two N-bit digitized read data signals DRD0 and DRD1 may be passed through a pulse shaping filter 38 prior to being coupled to multiplexing block 20. The pulse shaping filter provides digital filtering at the cost of a small amount of delay with two user selectable coefficients PC1 and PC2, independently programmable in the filter structure. This pulse shaping filter, of course, is in addition to any filtering done in the analog domain, and is an example of the flexibility and adaptability of the present invention. In particular, the effect of the pulse shaping filter may be eliminated by multiplexing block 20, or alternatively, the pulse shaping filter may be used with coefficients user selected, and thus variable, to provide the best performance of the overall storage system read channel with the flexibility to accommodate changes in pulse shape when changing from one recording zone to another, and to allow coefficient variations as part of overall device parameter variations for systematic retries upon the detection of uncorrectable errors in the subsequent error detection and correction (EDAC) operations. The pulse shaping filter of the preferred embodiment is a finite impulse response digital filter which means that the output is a function of the current and past inputs but not a function of its own past outputs. The delays necessary for the filter to remember the past inputs are shared by delay 36 to provide a separate delay path to multiplexing block 20. The delay path through delay 36 provides an amount of delay equivalent to the delay of pulse shaping filter 38. Multiplexing block 20 is provided to give a maximum of flexibility in modes of usage, by providing a separate source of input for the transition detector and the group of blocks comprising the sequence detector 40 (by way of spectrum smoothing filter 42), the gain control circuitry 32 and the timing recovery circuitry 34. The multiplexing block is designed so that all blocks may operate upon the raw input samples provided by DRD0 and DRD1, or alternatively the pulse shaping filter may be placed in one of the multiplexing block's output paths with the delay placed in the other path. The delay is necessary in this case so that the transition detector's outputs are synchronized with the sample values reaching the gain control circuitry and timing recovery circuitry. Finally, the pulse shaping filter may feed both of the multiplexing block's output paths. In general the multiplexing block could be designed so that by programming the multiplexing block each block at the multiplexing block's outputs (transition detector 22, gain control 32, timing recovery 34, and sequence detector 40 by way of spectrum smoothing filter 42) could receive raw input samples, delayed raw input samples, or filtered input samples independent of the data received by the other blocks. In the preferred embodiment of the present invention however, the gain control circuitry and the timing recovery circuitry have the capability of compensating for the pulse shape in an effort to increase the accuracy of the gain and timing recovery loops, and to reduce the amount of circuitry, the gain control circuitry and timing recovery circuitry assume the same pulse shape for which sequence detector 40 is programmed. This basic pulse shape received by the sequence detector is only marginally affected by the addition of the spectrum smoothing filter, which is designed to reduce only the head bumps at the tails of the pulse and does not seriously affect the center of the pulse except to correct for head bumps due to neighboring pulses. In that regard, the present invention includes a channel quality circuit 46 for measuring the quality of the read channel as earlier described. This provides not only quantitative channel evaluation, but in addition allows selection of read channel parameters such as, but not limited to, the coefficients PC1 and PC2 in the pulse shaping filter to best adapt the read channel to the characteristics of the storage medium and the pulse form and characteristics being read therefrom.

The present invention further includes a sequence detector 40 which receives as its input the two N-bit digital read data signals DRD0 and DRD1 as may be modified by the pulse shaping filter 38 and as may be additionally modified by the spectrum smoothing filter 42. In that regard, the spectrum smoothing filter 42, as shown in F*igure* 6 hereof, contains two delays FD1 and FD2 and four coefficients SC1, SC2, SC3 and SC4, all of which are independently programmable. The delays may be programmed from 0 to 23 channel bit intervals. The entire spectrum smoothing filter, or just its precursor correcting portion 43, can be disabled. The spectrum smoothing filter is designed to reduce the undershoots from the finite pole tips of a thin film head, or to reduce the bumps from the secondary gap of a single or double-sided MIG head. In the frequency domain, the filter acts to smooth out undulations caused by head bumps. If the precursor is disabled, the delay of the filter is disabled, whereas if a head which is not subject to head bumps is used, the post-cursor may be disabled.

The pulse shaping filter and the spectrum smoothing filter together form a digital equalizer which can modify the equalization done in the analog filter of the companion integrated circuit, and along with the companion integrated circuit provides support for changing equalization needs from head to head and zone to zone of the magnetic storage device. The parameters for the pulse shaping filter and the spectrum smoothing filter are loaded and/or varied by microcontroller 44 on initialization and during head seeks.

The sequence detector 40 is a partial response sequence detector. This allows the analog response of the read channel to a storage medium transition to overlap with the response to adjacent transitions associated with subsequent information bits. In comparison to most prior art read channels for magnetic storage media, the use of a partial response detector allows higher information storage densities in comparison to the prior art alternative of requiring the medium transitions to be sufficiently spaced from each other so that the read signal responses do not overlap significantly, thereby allowing each transition to be individually detected irrespective of the nearest neighboring transitions.

The particular sequence detector used in the present invention is a uniquely modified form of Viterbi detector which substantially preserves the full performance of the Viterbi algorithm in a substantially reduced complexity sequence detector. The basic Viterbi algorithm is described in the book "Fast Algorithms for Digital Signal Processing" by Richard E. Blahut, 1985, pages 387-399. In accordance with the Viterbi algorithm, a Viterbi detector does not attempt to decide whether a medium transition has occurred immediately upon receipt of the read sample or samples that correspond to that transition. Rather, as samples are taken from the read signal, the Viterbi detector keeps a running tally of the error between the actual sample sequence and the sample sequence that would be expected if the medium had been written with a particular sequence of transitions. Such an error tally is simultaneously kept for several possible transition sequences. As more samples are taken, less likely choices for transition sequences are pruned from consideration. If a set of possible sequences of medium transitions is appropriately constrained, then the location of each medium transition becomes known with a high degree of likelihood within a reasonable time after taking the samples corresponding to that transition. Because of the time delay between a sample acquisition and the determination of whether that sample represented a transition or an absence of a transition, the gain control circuit 32 and the timing recovery circuit 34 are both still referenced to the output of the transition detector 22, which has a more immediate response to the occurrence of a transition. Also, while in general the output of the sequence detector, when used, should be more accurate in ultimately determining whether a transition occurred at a particular bit time, an error in the output of the peak detector will have little effect on gain and timing. Specifically, failure to detect a transition will only slightly delay gain control and timing error corrections, and an isolated false detection of a transition will only slightly perturb the gain control and timing accuracy. This should be more than made up by the increased accuracy of the bit stream detection by the sequence detector's consideration of what comes before and after a particular digitized read data sample.

If the present invention is realized in an embodiment wherein digitized read data is processed a single bit time's worth at a time, a Viterbi detector of a conventional design may be used, or if two or more bit time's worth of samples are to be processed simultaneously, as in the preferred embodiment of the present invention, a conventional Viterbi detector could be modified for that purpose. However, in the preferred embodiment of the present invention, the uniquely modified form of Viterbi detector used is that disclosed in a co-pending application for patent entitled "Method and Apparatus for Reduced-Complexity Viterbi-type Sequence Detectors" filed Mar. 16, 1992 as Ser. No. 07/852,015, the disclosure of which is incorporated herein by reference.

The Background, Specification and Drawings from that application are attached hereto as Appendix 5.

In a typical Viterbi detector implemented using the ADD, COMPARE, SELECT (ACS) method, each state in the expected sample sequence model is associated with a hardware module to perform the functions of adding new branch error metrics to path error metrics, comparing path error metrics, and selecting the path having the lowest path metric. In the sequence detector used in the preferred embodiment in accordance with the co-pending application, an ACS module may have two or more sequence model states dynamically associated with it such that at some times, one sequence model state is associated with it, and at other times, another sequence model is associated with it. This reduces the number of ACS modules required and also reduces the size and complexity of the detector path memories which must store one path for each ACS module. Groups of sequence model states may be chosen to share an ACS module without significant loss in performance as compared to the conventional Viterbi detector. These detectors support a wide range of sample models by making the expected sample sequence of an isolated medium transition programmable through control 44. By way of specific example, the sequence detector used in the CL-SH4400 disclosed herein will support the PR4, EPR4 and EEPR4 sample models, among others. In addition, the alternating polarity of pulses is enforced, as is a minimum run length constraint of d=1.

The d=1 constraint in the RLL(d,k) coding is an important constraint in the present invention, especially for applications where the storage system uses thin-film magnetic media. For thin-film magnetic media, there is an effect known as partial erasure which puts a practical limit on how close two magnetic transitions may be written. The effect is due to a ragged (or zig-zag) boundary between regions of opposite magnetization. As the transitions become too close, the zig-zags begin to overlap and the area of opposite magnetic polarity between two transitions starts to disappear. The result is that as the read head flies over the partially erased transitions, the amplitude of the corresponding read signal pulses is diminished. This is a non-linear, data pattern dependent effect which is difficult to compensate for. The d=1 constraint remedies this situation by preventing magnetic transitions in two consecutive channel bit times. The drawback is that the d=0 constrained code may typically represent 8 NRZ bits with 9 RLL bits (rate 8/9) while the d=1 constrained code can only represent 6 NRZ bits with 9 RLL bits (rate 2/3). For example, to store 8 NRZ bits, the d=0 constrained code will store 9 channel bits while the d=1 constrained code will store 12 channel bits in the same amount of space, hence the d=1 channel bit interval is 3/4 the size of the d=0 channel bit interval. Fortunately, the magnetic transitions have a minimum spacing of 2 channel bits and therefore the minimum distance between two transitions has increased by 3/2 with respect to the corresponding d=0 constrained code. This makes the d=1 constrained read channel a good solution for increasing storage capacity in applications where the minimum transition spacing is close enough for partial erasure effects to be noticeable.

The sequence detector utilized in the CL-SH4400 can be programmed to operate on any channel response which can be well represented by sequences in the form of a, b, 1, c wherein the selection of a, b and c allow the ability to accommodate pulse asymmetry which might otherwise require that the read signal pass through an analog or digital phase equalizer prior to entering the sequence detector. The levels a, b and c also give the ability to select between center and side sampling. Center-sampled pulses are notably those for which the sample levels a, b, 1, and c are selected such that 1 is very near the peak of the pulse, b and c are roughly halfway down their respective sides of the pulse, and a is near zero, for example, the sample levels 0, 1/2, 1 and 1/2. Side-sampled pulses are notably those for which the sample levels are selected such that 1 and b (which is about 1) straddle the peak of the pulse, for example the sample levels 5/16, 1, 1 and 5/16. This choice of side versus center sampling also affects the manner in which gain error and phase error are calculated in the gain control loop and timing recovery loop. The option to choose between side and center sampling allows the user a wider range of possible trade-offs between the amount of equalization (filtering) used to shape the raw pulse shape into the target pulse shape of the sequence detector and the amount of noise enhancement which arises as a consequence of shaping the raw pulse. Hence the read channel can be more suitably matched to the storage medium to provide better performance.

Figure 7:
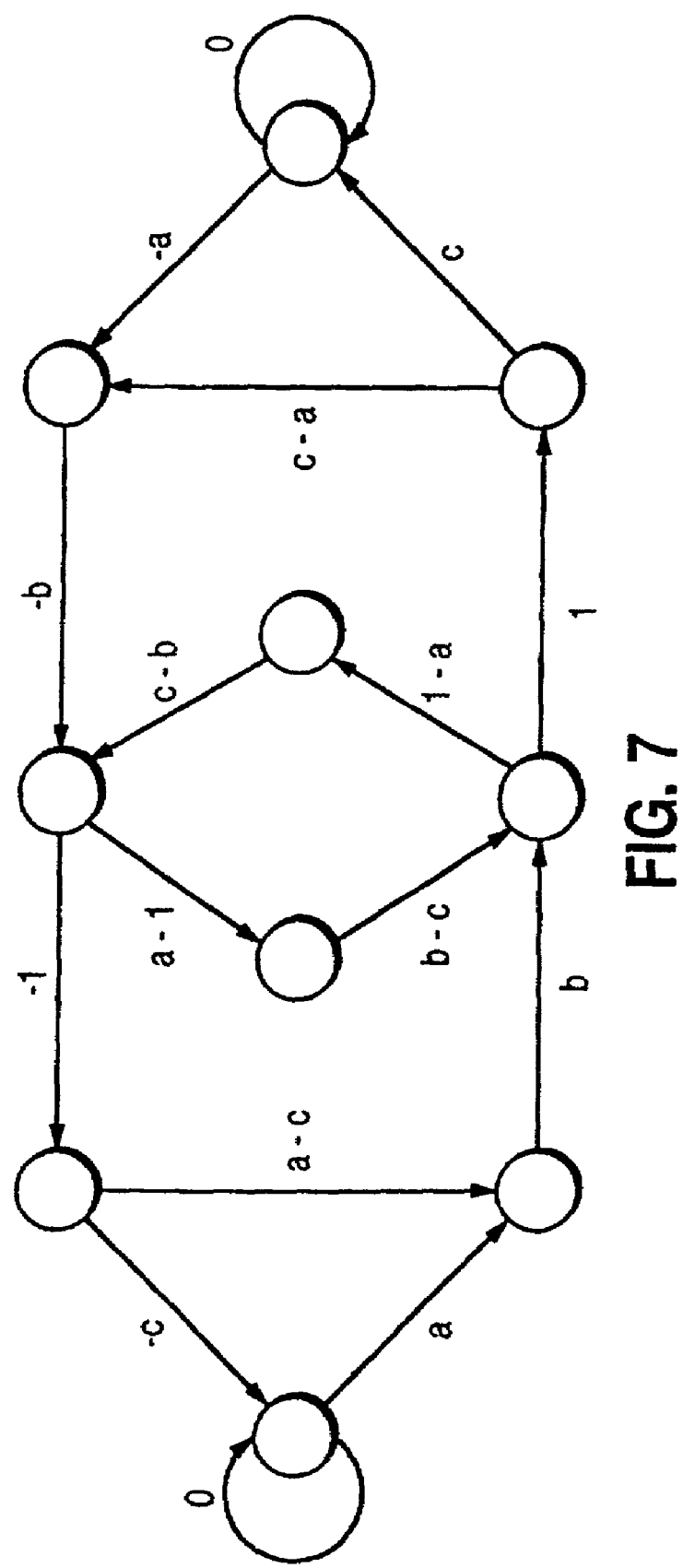
FIG. 7 is a state transition diagram for a sequence detector matched to a trellis code (RLL d=1 constraint).

The state machine model for the partial response sequence detector 40 is shown in FIG. 7. Note that the model embodies several kinds of information. First, the isolated pulse sample values a, b, 1, and c are included. Second, the alternating polarity of pulses constraint is enforced. Third, the minimum run-length constraint of d=1 is enforced; that is, the state transition diagram is matched to a trellis code constraint.

Referring again to FIG. 3, for writing information to the storage medium, the NRZ input data is provided to a run length limited encoder 48, in the CL-SH4400 through a user selectable serial line, a two bit parallel form or an eight bit byte parallel form. The run length limited encoder provides the desired run length limited coding, in the preferred embodiment an RLL (1,7) coding, randomized before encoding or not, depending upon the enabling of the data randomizer 30, with the encoded data being provided to multiplexer 52, in the preferred embodiment in a two-bit wide form. In the case of writing to the storage medium, the serial enable signal SER_ENA will be deasserted so that the multiplexer 50 and 52 will provide the encoded data bits 1 (the most significant of the two parallel data bits) and 0 (the least significant of the two parallel data bits) to the companion integrated circuit to write the same to the storage medium.

When not writing, the serial enable signal SER_ENA may be asserted, at which time multiplexers 50 and 52 are switched so that serial control address and data may be transferred on the SER_DAT line to the companion integrated circuit synchronous with the associated serial clock signal SER_CLK as the output signals of the two multiplexers 50 and 52. Multiplexing of these two chip pins of the single chip CL-SH4400 integrated circuit helps reduce the pin count without loss of performance or flexibility. This serial interface is provided to eliminate the need for the companion integrated circuit to interface with the bus of the microprocessor and eliminates a potential coupling between the noisy microprocessor bus and in the sensitive analog circuitry of the read channel in the companion integrated circuit. This also provides a benefit in pin count since the microprocessor bus interface would require numerous additional pins on the companion integrated circuit. Each of the control registers of the companion integrated circuit are mapped to corresponding register addresses in the integrated circuit of the present invention, when one of these registers is written to, the serial interface initiates a serial transfer write operation, sending the data to the appropriate register in the companion integrated circuit. The preferred embodiment of the present invention includes two modes, one in which a status bit which can be read to determine whether or not the serial transfer write operation is complete and another in which the integrated circuit of the preferred embodiment forces the microprocessor to pause while the serial transfer write operation is in progress. Similarly, a read of a register in the companion integrated circuit is performed by reading the corresponding register in the integrated circuit of the present invention. This initiates a serial transfer read operation. In the first of two serial interface read modes, the integrated circuit of the preferred embodiment will signal the microprocessor to pause until the serial transfer read operation is complete at which time the serially transferred data will be accessible at the pins of the integrated circuit of the present invention. In a second mode, the integrated circuit of the preferred embodiment will return the data left over from the previous serial transfer read operation, and once the current read operation is completed, it will initiate a new serial interface read operation with the address just supplied. The preferred embodiment includes a status bit which can be read to determine whether or not the new serial transfer read operation is complete. Once complete, the microprocessor may initiate a second read operation to retrieve the data originally desired and to initiate another serial transfer read operation at a new address for future use if desired. Summarizing the two modes, in one mode the microprocessor is made to wait, in the second mode the microprocessor must read the register twice, once to supply the register address and second time to retrieve the data and possibly supply the next register address.

In the embodiments hereinbefore described, numerous parameters were described as being programmable, and as such, as being useful for varying on retries in the event of the detection or repeated detection of an uncorrectable error. Obviously additional programmable or fixed parameters may also be incorporated, such as by way of example, additional filter coefficients in the pulse shaping and other filters. It should be noted that particularly certain parameters, such as the parameters of the pulse shaping filter 38 and the spectrum smoothing filter 42, may be made adaptive, or a combination of adaptive and programmable. By way of example, coefficients may be made adaptive, while the time constants of the adaptive characteristics and perhaps offsets, wave shapes, asymmetries and compensation for nonlinearities are made programmable. In that regard, it should be noted that given an uncorrectable or repeated uncorrectable error, there is no harm in further attempts at a successful read with different parameters, side versus center sampling, filtering versus different, less or no filtering, etc. Further, normally one would use the sequence detector on read for its superior detection capabilities over a peak detector. However in the case of hard errors wherein the errors in the output of the sequence detector exceed the error correction capability of the EDAC code used, a further retry strategy may include switching to an output derived from the peak detector, as previously described, rather than the sequence detector. This will add noise errors characteristic of transition detection effectively within the single bit-time of the possible transition, but will eliminate whatever additional propagation of the hard errors (for example media defects) may be caused by the sequence detector. The effect of the noise errors may be substantially eliminated by multiple reads, followed by a majority vote to cancel all or most of the effect of the noise errors, yielding an opportunity for a successful error correction when the same could not be achieved with the sequence detector in the path. Here again, pulse shaping filter characteristics may be varied and multiple retries of the peak detector multiple reads executed, as reasonable exhaustion of all opportunity for a successful read is better than a fatal error.

There have been disclosed and described herein preferred and alternate embodiments of a new and unique synchronous read channel which include a sequence detector with a flexible architecture capable of implementing a broad range of partial response polynomials. While an embodiment of the present invention which supports only one or two partial response channels would be highly useful, the detector used in the preferred embodiment of the present invention supports a broad class of partial response channels, including but not limited to PR4 (1,7), EPR4 (1,7) and EEPR (1,7). While the sequence detector is normally operative upon a read, the output of a digital peak detector may be enabled as the output of the read channel if desired. These and other inventive features of the invention will be apparent from the preceding description.

Thus while a preferred and alternate embodiments of the present invention has been disclosed and described in detail herein, it will be obvious to those skilled in the art that various changes in form and detail may be made therein without departing from the spirit and scope thereof.

What is claimed is:

1. An integrated circuit synchronous read channel for receiving digitized read signals representing digitized samples of a read signal of a magnetic storage device and recovering digital data represented thereby, the integrated circuit comprising:
   a digital peak detector that operates to detect characteristics of the digitized read signals indicative of storage media transitions;
   timing recovery circuitry responsive to the digitized read signals and an output of the digital peak detector that operates to provide a timing control signal for controlling the timing of digitized samples of the read signal
   a sequence detector responsive to the digitized read signals that operates to receive a stream of the digitized read signals and determine a corresponding sequence of binary digital signals likely to be represented thereby;
   an RLL (d,k) decoder that operates to provide a run length limited decoded output by decoding the sequence of binary digital signals from the sequence detector, or to provide a run length limited decoded output by decoding a sequence of binary digital signals from the digital peak detector;
   digital pulse shaping filter circuitry that operates to modify the digitized read signals prior to receipt thereof by at least one of (i) the sequence detector, (ii) the digital peak detector and (iii) the timing recovery circuitry; and
   delay circuitry that operates to delay the coupling of the digitized read signals to the digital peak detector or the timing recovery circuitry to match the delay of the coupling of the digitized read signals to the timing recovery circuitry or the digital peak detector, respectively, imposed by the digital pulse shaping filter circuitry.

2. The integrated circuit synchronous read channel of claim 1 wherein the digital pulse shaping filter circuitry comprises variable filter parameters.

3. The integrated circuit synchronous read channel of claim 1 wherein the digital pulse shaping filter circuitry comprises programmable filter parameters.

4. The integrated circuit synchronous read channel of claim 1 further comprising spectrum smoothing filter circuitry that operates to filter the digitized read signals prior to processing by the sequence detector.

5. The integrated circuit synchronous read channel of claim 1, wherein the sequence detector operates to allow selection between center and side sampling of the digitized read signals.

6. The integrated circuit synchronous read channel of claim 1, wherein the sequence detector operates to accommodate pulse asymmetry in the digitized read signals.

7. The integrated circuit synchronous read channel of claim 1, wherein the sequence detector is a partial response sequence detector.

8. The integrated circuit synchronous read channel of claim 1, wherein the timing recovery circuit operates in at least one of an acquisition mode and a tracking mode.

9. The integrated circuit synchronous read channel of claim 1, wherein the timing recovery circuit is programmable.

10. The integrated circuit synchronous read channel of claim 1, wherein the timing recovery circuit operates to compute at least one of phase error and frequency error.

11. The integrated circuit synchronous read channel of claim 1, wherein the timing recovery circuit operates to compute timing error at transition times.

12. An integrated circuit synchronous read channel for receiving digitized read signals representing digitized samples of a read signal of a magnetic storage device and recovering digital data represented thereby comprising:
   a digital peak detector that operates to detect characteristics of the digitized read signals indicative of storage media transitions;
   timing recovery circuitry responsive to the digitized read signals and an output of the digital peak detector that operates to provide a timing control signal for controlling the timing of digitized samples of the read signal
   a sequence detector responsive to the digitized read signals that operates to receive a stream of the digitized read signals and determine a corresponding sequence of binary digital signals likely to be represented thereby; and
   an RLL (d,k) decoder that operates to provide a run length limited decoded output by decoding the sequence of binary digital signals from the sequence detector, or to provide a run length limited decoded output by decoding a sequence of binary digital signals from the digital peak detector, wherein the sequence detector is operable to process two digitized read signals at a time, the two digitized read signals representing digitized samples of a read signal of a magnetic storage device during two successive channel bit times.

13. The integrated circuit synchronous read channel of claim 12 further comprising digital pulse shaping filter circuitry that operates to modify the digitized read signals prior to receipt thereof by at least one of (i) the sequence detector, (ii) the digital peak detector and (iii) the timing recovery circuit.

14. The integrated circuit synchronous read channel of claim 13 wherein the digital pulse shaping filter circuitry comprises variable filter parameters.

15. The integrated circuit synchronous read channel of claim 13 wherein the digital pulse shaping filter circuitry comprises programmable filter parameters.

16. The integrated circuit synchronous read channel of claim 13 further comprising spectrum smoothing filter circuitry that operates to filter the digitized read signals prior to processing by the sequence detector.

17. The integrated circuit synchronous read channel of claim 12, wherein the sequence detector operates to allow selection between center and side sampling of the digitized read signals.

18. The integrated circuit synchronous read channel of claim 12, wherein the sequence detector operates to accommodate pulse asymmetry in the digitized read signals.

19. The integrated circuit synchronous read channel of claim 12, wherein the sequence detector is a partial response sequence detector.

20. The integrated circuit synchronous read channel of claim 12, wherein the timing recovery circuit operates in at least one of an acquisition mode and a tracking mode.

21. The integrated circuit synchronous read channel of claim 12, wherein the timing recovery circuit is programmable.

22. The integrated circuit synchronous read channel of claim 12, wherein the timing recovery circuit operates to compute at least one of phase error and frequency error.

23. The integrated circuit synchronous read channel of claim 12, wherein the timing recovery circuit operates to compute timing error at transition times.

* * * * *